United States Patent
Jin et al.

(10) Patent No.: US 9,478,639 B2
(45) Date of Patent: Oct. 25, 2016

(54) ELECTRODE-ALIGNED SELECTIVE EPITAXY METHOD FOR VERTICAL POWER DEVICES

(71) Applicant: Infineon Technologies Austria AG, Villach (AT)

(72) Inventors: Minghao Jin, Villach (AT); Oliver Blank, Villach (AT); Rudolf Rothmaler, Villach (AT); Johannes Baumgartl, Riegersdorf (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/633,359

(22) Filed: Feb. 27, 2015

(65) Prior Publication Data

US 2016/0254367 A1    Sep. 1, 2016

(51) Int. Cl.
| | | |
|---|---|---|
| H01L 21/00 | (2006.01) | |
| H01L 29/66 | (2006.01) | |
| H01L 21/02 | (2006.01) | |
| H01L 29/49 | (2006.01) | |

(52) U.S. Cl.
CPC ... *H01L 29/66666* (2013.01); *H01L 21/02238* (2013.01); *H01L 21/02255* (2013.01); *H01L 21/02381* (2013.01); *H01L 21/02532* (2013.01); *H01L 29/4916* (2013.01); *H01L 29/66545* (2013.01)

(58) Field of Classification Search
USPC ......................................................... 438/52
See application file for complete search history.

(56) References Cited

U.S. PATENT DOCUMENTS

| | | |
|---|---|---|
| 5,017,504 A | 5/1991 | Nishimura et al. |
| 6,787,847 B2 | 9/2004 | Disney |
| 6,882,005 B2 | 4/2005 | Disney |
| 7,767,527 B2 | 8/2010 | Poelzl et al. |
| 7,829,944 B2 | 11/2010 | Disney |
| 7,859,037 B2 | 12/2010 | Parthasarathy et al. |
| 8,022,456 B2 | 9/2011 | Parthasarathy et al. |
| 2002/0056884 A1 | 5/2002 | Baliga |
| 2005/0032291 A1 | 2/2005 | Baliga |
| 2005/0167749 A1 | 8/2005 | Disney |
| 2006/0097312 A1 | 5/2006 | Poelzl et al. |
| 2006/0209586 A1 | 9/2006 | Hirler |
| 2008/0073707 A1 | 3/2008 | Darwish |
| 2009/0085106 A1 | 4/2009 | Matsunaga |
| 2009/0108343 A1 | 4/2009 | Nemtsev et al. |
| 2010/0155773 A1 | 6/2010 | Parthasarathy et al. |
| 2010/0308400 A1 | 12/2010 | Darwish et al. |
| 2013/0062688 A1 | 3/2013 | Kobayashi |
| 2013/0137230 A1 | 5/2013 | Blank |

FOREIGN PATENT DOCUMENTS

CN    101572236 A    11/2009

*Primary Examiner* — Timor Karimy
(74) *Attorney, Agent, or Firm* — Murphy, Bilak & Homiller, PLLC

(57) ABSTRACT

A method of forming trench electrode structures includes forming a first dielectric layer on a semiconductor substrate, forming a second layer above the first dielectric layer and forming an opening which extends through the second layer and the first dielectric layer to the semiconductor substrate such that part of the semiconductor substrate is uncovered. The method further comprises forming an epitaxial layer on the uncovered part of the semiconductor substrate, removing the second layer after forming the epitaxial layer and filling an open space formed by removing the second layer with an electrically conductive material. The electrically conductive material forms an electrode which is laterally surrounded by the epitaxial layer.

20 Claims, 5 Drawing Sheets

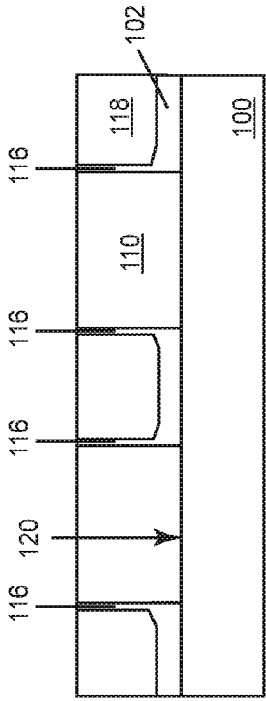
Figure 1A
Figure 1B
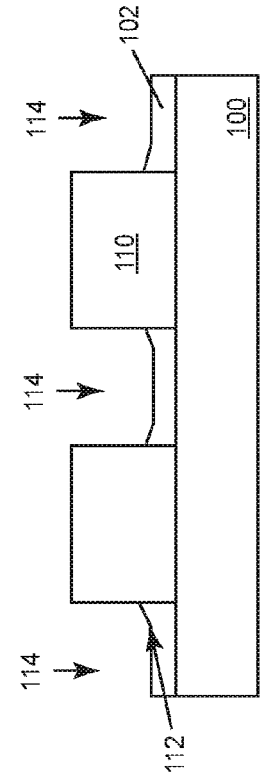
Figure 1C
Figure 1D
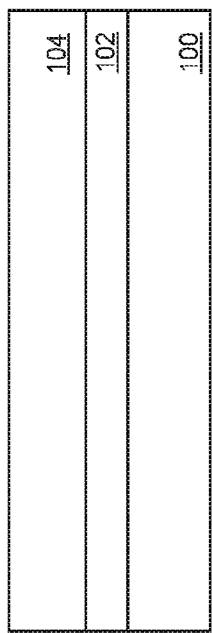
Figure 1G
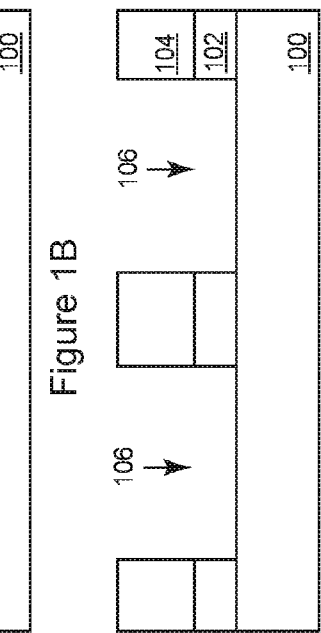
Figure 1F
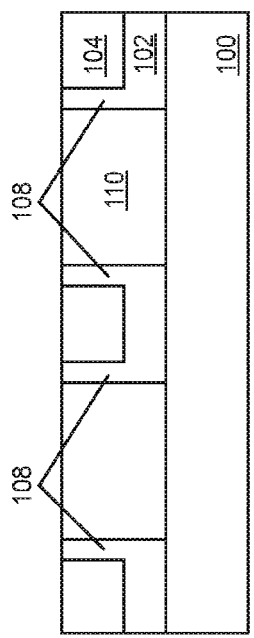
Figure 1E

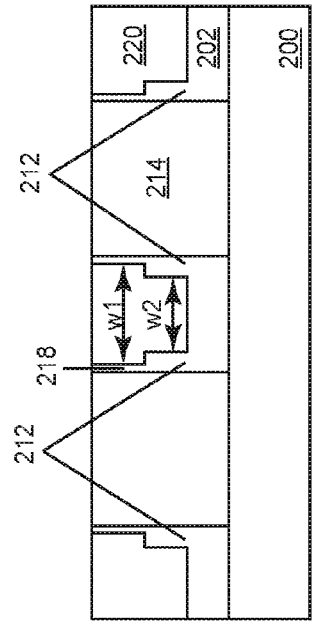
Figure 2G
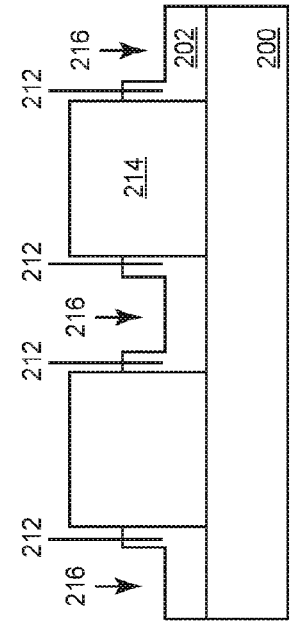
Figure 2F
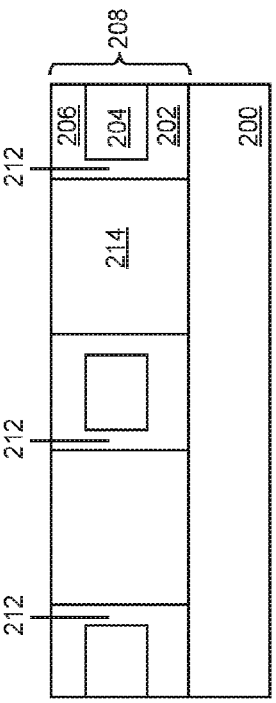
Figure 2E
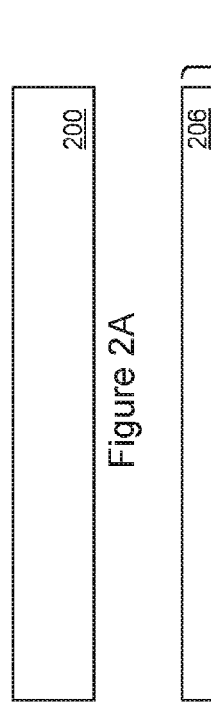
Figure 2A
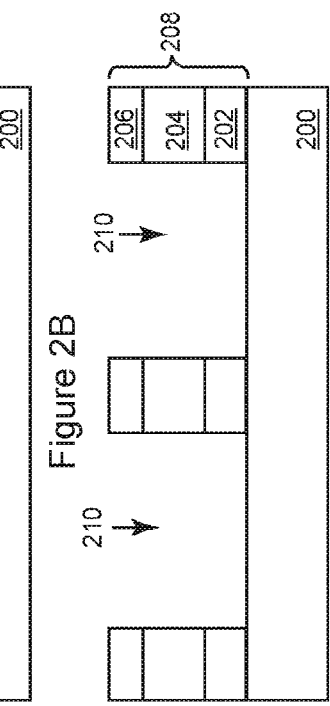
Figure 2B
Figure 2C
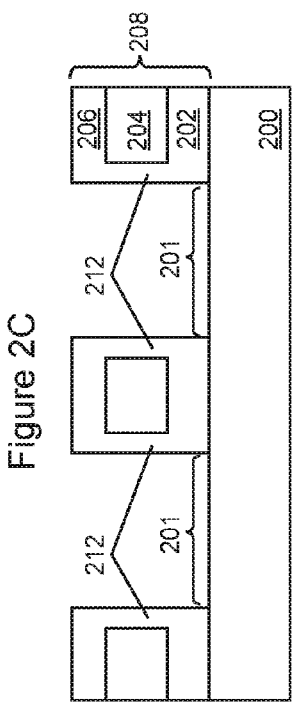
Figure 2D

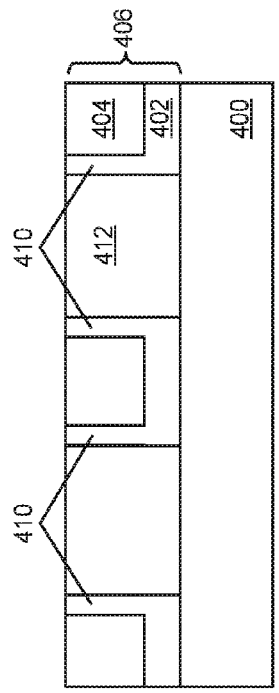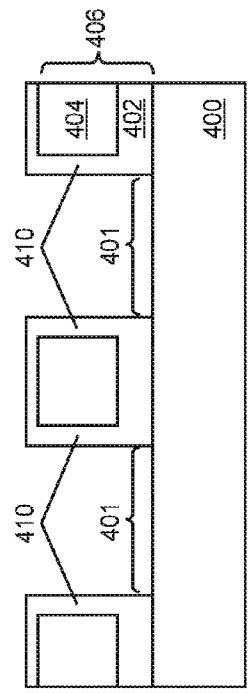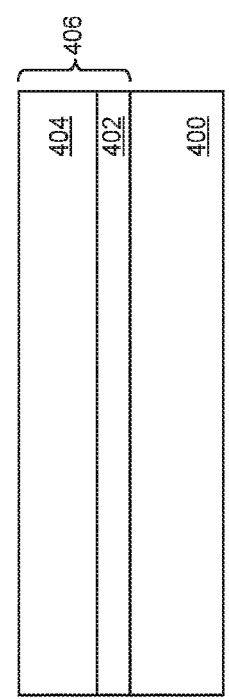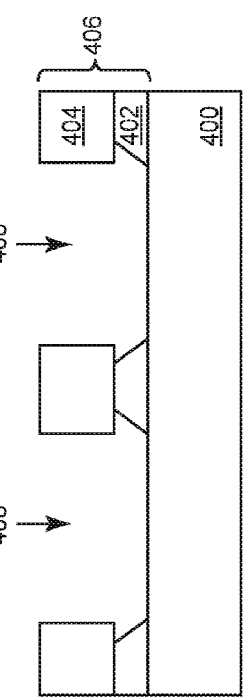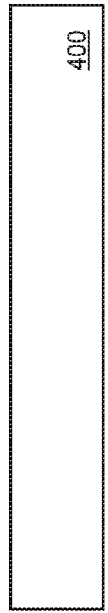
Figure 5A
Figure 5B
Figure 5C
Figure 5D
Figure 5E
Figure 5F

ELECTRODE-ALIGNED SELECTIVE EPITAXY METHOD FOR VERTICAL POWER DEVICES

TECHNICAL FIELD

The present application relates to vertical power devices, in particular the fabrication of electrode structures for vertical power devices.

BACKGROUND

Trenches are conventionally formed in a semiconductor substrate by etching into the substrate. The etch chemistry results in the trench width being directly proportional to the trench depth so that deeper trenches tend to be wider than shallower trenches. For applications that require low channel resistance, e.g. small signal, low voltage FET, etc., hexagonal, triangular and square trench geometries are commonly employed to increase the channel (width) density. Such trench geometries have inhomogeneous trench depth distribution, corresponding to process window reduction, reliability degradation and/or an undesirable tradeoff between on-state resistance (Ron) and breakdown voltage. Vertical multi-poly electrode FETs require multiple fill-in, recess, and oxidation/CVD processes to stack up multiple poly electrodes, adding to process complexity and cost. It is also difficult to control the thickness and quality of the inter-poly dielectric, which negatively affects yield rate and device reliability. Furthermore, manufacturing cost increases with larger thermal budget and process complexity. Many applications require trench alignment with a specific silicon region. A 'safe' margin is usually required to inhibit the p-body from overlapping the vertical gate electrode, resulting in higher ohmic resistance. The additional margin also results in lower Miller capacitance (Cgd) which reduces switching frequency.

In the manufacturing process, it is difficult to control the implant through round trench corners which can cause inhomogeneous dopant distribution. In some region on the chip, the geometric layout and implant profile could possibly have non-negligible discrepancies with respect to the rest of the chip area. Such non-negligible discrepancies can lead to e.g. a weak point which restricts the design rules and requires precise process control or extra process steps to mitigate the effect.

Shrinking die (chip) size requirements exacerbates these problems, while the associated complex process and design rule requirements frustrate FET development, especially in low voltage and/or switching applications, resulting in long time-to-market. In some cases, a strip-like trench has been used to mitigate the trench depth variation problem even though each strip trench must disabled at the edge termination region. Such a trench design typically leads to a compromised trade-off between process window and device performance. Other issues such as rounded corners are conventionally circumvented by sacrificial material deposit and each back. For example, an oxidized gate trench sidewall can be employed to regrow epitaxy silicon. However, the process is complex and increases manufacturing cost and development cycle (time-to-market).

SUMMARY

According to an embodiment of a method of forming trench electrode structures, the method comprises: forming a first dielectric layer on a semiconductor substrate; forming a second layer above the first dielectric layer; forming an opening which extends through the second layer and the first dielectric layer to the semiconductor substrate such that part of the semiconductor substrate is uncovered; forming an epitaxial layer on the uncovered part of the semiconductor substrate; removing the second layer after forming the epitaxial layer; and filling an open space formed by removing the second layer with an electrically conductive material, the electrically conductive material forming an electrode which is laterally surrounded by the epitaxial layer.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A through 1G illustrate an embodiment of a method of forming trench electrode structures.

FIGS. 2A through 2G illustrate another embodiment of a method of forming trench electrode structures.

FIGS. 5A through 5F illustrate still another embodiment of a method of forming trench electrode structures.

DETAILED DESCRIPTION

Figure 3A:
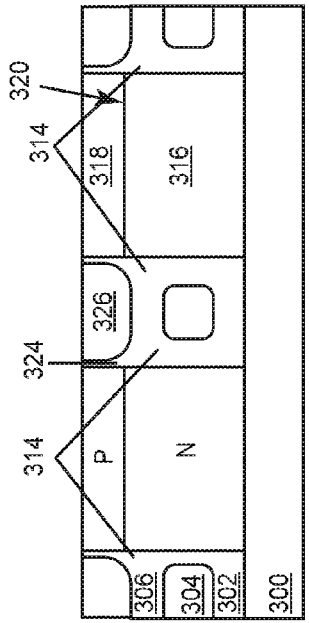
FIGS. 3A through 3G illustrate yet another embodiment of a method of forming trench electrode structures.

According to embodiments described herein, trench electrode structures are formed in which the width of the trench electrode structures is independent of the trench depth. The trench depth is defined by a thin-film deposition process which aligns the device junction using selective epitaxy. The depth of the resulting trench structures is independent of geometric layout, and therefore the channel width can be increased independent of trench depth.

FIGS. 1A through 1G illustrate an embodiment of a method of forming trench electrode structures. The trench electrode structures can be gate electrode structures with a gate electrode and field plate in the same trench, gate electrode structures with a gate electrode and field plate in different trenches, field electrode structures, etc.

In FIG. 1A, a semiconductor substrate 100 is provided. The semiconductor substrate 100 can be an epitaxial layer grown on a semiconductor wafer or the wafer itself. The semiconductor substrate 100 can be made of Si or a compound semiconductor such as SiC, GaAs, GaN, etc.

In FIG. 1B, a first dielectric layer 102 is formed on (i.e. touching and being supported by) the top surface of the semiconductor substrate 100 and a second layer 104 is formed on the first dielectric layer 102. In one embodiment, the semiconductor substrate 100 is made of Si, the first dielectric layer 102 comprises silicon oxide and the second layer 104 comprises silicon nitride. Any standard deposition process can be used to form the silicon oxide and silicon nitride layers 102, 104. In general, the first dielectric layer 102 and the second layer 104 comprise different materials.

In FIG. 1C, openings 106 are formed which extend through the second layer 104 and into the first dielectric layer 102. In the case of a nitride second layer 104, the nitride layer 104 can be patterned and etched and the nitride etching process stopped on the underlying oxide layer 102.

In FIG. 1D, an oxide 108 is deposited along the bottom and sidewalls of the openings 106 prior to an epitaxy fill process. In one embodiment, the semiconductor substrate 100 is thermally oxidized after the openings 106 are formed and prior to depositing the oxide 108 along the bottom and sidewalls of the openings 106. In each case, the oxide 108 is removed from the bottom of the openings 106 prior to the epitaxy fill process e.g. using an anisotropic dry etch process. As a result, the openings 106 extend through the second layer 104 and the first dielectric layer 102 to the semiconductor substrate 100 such that part 101 of the semiconductor substrate 100 is uncovered and oxide 108 is provided along the sidewalls of the openings 106 as shown in FIG. 1D.

In FIG. 1E, an epitaxial layer 110 such as Si epitaxy is formed on the uncovered part 101 of the semiconductor substrate 100. Any standard selective epitaxy and planarization process can be used to yield the structure shown in FIG. 1E. For example, a homoepitaxy process can be employed which is a kind of epitaxy performed with only one material, in which a crystalline film is grown on a substrate or film of the same material. In another example, a heteroepitaxy process can be employed which is a kind of epitaxy performed with materials that are different from each other. In heteroepitaxy, a crystalline film grows on a crystalline substrate or film of a different material. Still other types of epitaxy processes can be used. The oxide 108 previously formed on the sidewalls of the second layer 104 aids the selective epitaxy growth process in the case of nitride used as the second layer, reducing interface states.

In FIG. 1F, the second layer 104 is removed after forming the epitaxial layer 110. Any standard nitride removal process can be used in the case of a nitride second layer 104. Removal of the nitride layer 104 from the underlying oxide layer 102 results in a graded step 112 in the oxide layer 102 which increases toward the sidewalls of the epitaxial layer 110. Open spaces 114 in the stack of layers 102, 104 on the semiconductor substrate 100 result from removal of the second layer 104. The oxide 108 previously formed along the sidewalls of the second layer 104 can be removed from the lateral sides of the epitaxial layer 110 prior to filling the open spaces 114.

In FIG. 1G, a dielectric material 116 is formed on the exposed lateral sides of the epitaxial layer 110. In the case of gate electrode structures, the dielectric material 116 is a gate dielectric such as a gate oxide. In the case of field plate trenches, the dielectric material 116 is a field oxide. The oxide formation process also removes defects in the epitaxial layer 110. The open spaces 114 formed in the stack of layers 102, 104 on the semiconductor substrate 100 after the epitaxy process are then filled with an electrically conductive material 118. The electrically conductive material 118 can be highly doped polycrystalline silicon, a silicide-polysilicon combination or metal such as tantalum, tungsten, tantalum nitride, titanium nitride, etc. The electrically conductive material 118 forms an electrode in each open space 114 which is laterally surrounded by the epitaxial layer 110. The electrodes 118 can be gate electrodes in the case of gate electrode structures or field plates in the case of field plate electrodes.

The depth of the resulting trench structures is independent of geometric layout, and therefore channel width can be increased independent of trench depth in the case of gate electrode structures. Moreover, a high selectivity etch between the first dielectric layer 102 (e.g. oxide) and the semiconductor substrate 100 (e.g. Si) yields trench structures having a relatively homogeneous trench depth distribution and the trench depth can be precisely controlled, thereby reducing variation and improving process window and device performance. The trench formation processes described herein also mitigate adverse effects such as rounded trench corners, inter-poly oxide thickness variation and quality, etc., reduce mechanical stress, and provide for highly flexible electrode structures. In addition, the selective epitaxy growth process described herein yields self-aligned device semiconductor regions such as the mesa epi 110 and underlying p-n junction 120 in the case of the mesa epi 110 being doped oppositely as the semiconductor substrate 100. Also, multi-electrode structures can be fabricated with fairly low cost as described in greater detail later herein.

FIGS. 2A through 2G illustrate an embodiment of a method of forming gate trench electrode structure having a gate electrode and optional field plate in different trenches.

In FIG. 2A, a semiconductor substrate 200 is provided. The semiconductor substrate 200 can be an epitaxial layer grown on a semiconductor wafer or the wafer itself as previously described herein.

In FIG. 2B, a first oxide layer 202 is deposited on the semiconductor substrate 200, a nitride layer 204 is deposited on the first oxide layer 202 and a second oxide layer 206 is deposited on the nitride layer 204 to form an ONO (oxide-nitride-oxide) dielectric layer stack 208.

In FIG. 2C, openings 210 are formed which extend through the second oxide layer 206 and the nitride layer 204 and into the first oxide layer 202. Any standard ONO processing can be performed to yield the patterned ONO structure shown in FIG. 2C.

In FIG. 2D, an oxide 212 is deposited along the bottom and sidewalls of the openings 210 in the ONO dielectric layer stack 208 prior to an epitaxy fill process. The semiconductor substrate 200 can be thermally oxidized after the openings 210 are formed in the ONO dielectric layer stack 208 and prior to depositing the oxide 212 along the bottom and sidewalls of the openings 210. In each case, the oxide 212 is removed from the bottom of the openings 210 prior to the epitaxy fill process e.g. using an anisotropic dry etch process. As a result, the openings 210 extend through the ONO dielectric layer stack 208 to the semiconductor substrate 200 such that part 201 of the semiconductor substrate 200 is uncovered and oxide 212 is provided along the sidewalls of the openings 210 formed in the ONO dielectric layer stack 208.

In FIG. 2E, an epitaxial layer 214 such as Si epitaxy is formed on the uncovered part 201 of the semiconductor substrate 200. Any standard selective epitaxy and planarization process can be used as previously described herein.

In FIG. 2F, an oxide removal and recess process is performed in which the second oxide layer 206 is removed and the oxide 212 is removed from the upper part of the lateral sides of the epitaxial layer 214. The nitride layer 204 also is removed after forming the epitaxial layer 214. T-shaped open spaces 216 in the ONO dielectric layer stack 208 result from the oxide removal and recess process and nitride removal process.

In FIG. 2G, a gate dielectric 218 is formed on the exposed upper part of the lateral sides of the epitaxial layer 214. Any standard gate dielectric process can be used. The T-shaped open spaces 216 formed in the ONO dielectric layer stack 208 after the epitaxy process are then filled with an electrically conductive material 220 such as highly doped polycrystalline silicon, a silicide-polysilicon combination or metal as previously described herein. The electrically conductive material 220 forms a T-shaped gate electrode in each open space 216 which is laterally surrounded by the epitaxial layer 214 and insulated from the epitaxial layer 214 by the gate dielectric 218 in the upper part of the electrode trenches and by the oxide 212 deposited prior to the epitaxy fill process in the lower part of the electrode trenches. The T-shaped gate electrodes are wider (w1) in the upper part of the electrode trenches and narrower (w2) in the lower part of the trenches. Other gate electrode geometries/configurations can be realized by patterning the dielectric layers of the ONO layer stack 208 accordingly.

FIGS. 3A through 3G illustrate an embodiment of a method of forming trench electrode structures having a gate electrode and field plate in the same trench.

In FIG. 3A, a semiconductor substrate 300 is provided. The semiconductor substrate 300 can be an epitaxial layer grown on a semiconductor wafer or the wafer itself as previously described herein.

Figure 3B:
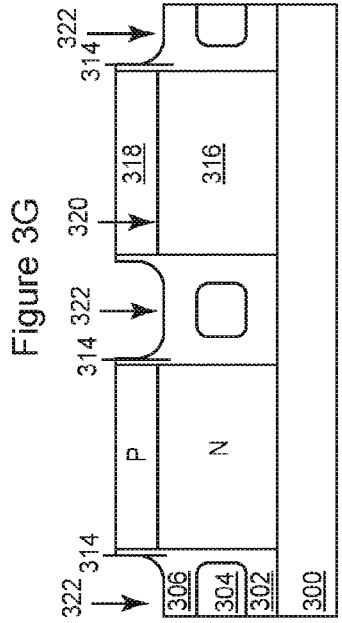

In FIG. 3B, a first oxide layer 302 is deposited on the semiconductor substrate 300, a layer 304 of electrically conductive material such as a polysilicon or metal layer is deposited on the first oxide layer 302, a second oxide layer 306 is deposited on the electrically conductive layer 304 and a nitride layer 308 is deposited on the second oxide layer 306 to form an OPON (oxide-poly-oxide-nitride) layer stack 310.

Figure 3C:
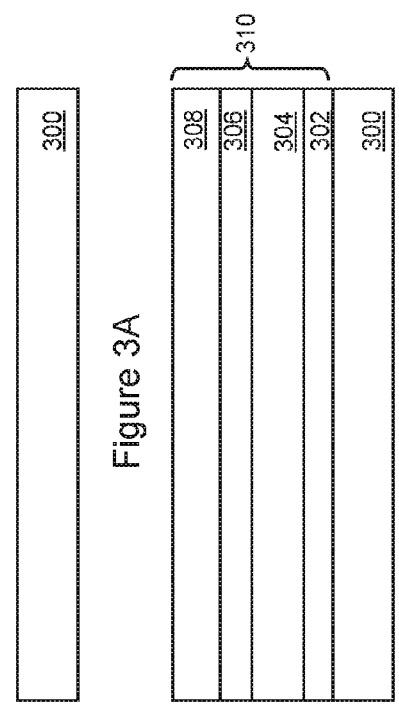

In FIG. 3C, openings 312 are formed which extend through the OPON layer stack 310 to the underlying semiconductor substrate 300. Any standard OPON processing can be performed to yield the openings 312 shown in FIG. 3C.

Figure 3D:
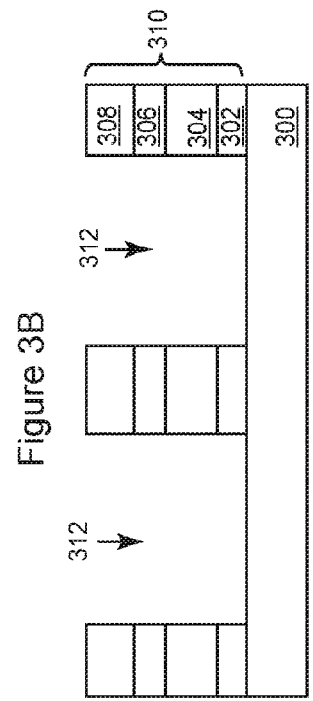

In FIG. 3D, an oxide 314 is deposited along the bottom and sidewalls of the openings 312 in the OPON layer stack 310 prior to an epitaxy fill process. The semiconductor substrate 300 can be thermally oxidized after the openings are formed in the OPON layer stack 310 and prior to depositing the oxide 314. The oxidation process illustrated in FIG. 3D yields a (thick) field oxide 314 in that the outer part of the electrically conductive islands 304' which remain after the openings 312 are formed in the OPON layer stack 310 is converted into oxide during this process. As such, the islands of nitride 308 which remain above the electrically conductive islands 304' are wider than the electrically conductive islands 304'. The oxide 314 is then removed from the bottom of the openings 312 prior to the epitaxy fill process e.g. using an anisotropic dry etch process. As a result, the openings 312 extend through the OPON layer stack 310 to the semiconductor substrate 300 such that part 301 of the semiconductor substrate 300 is uncovered and a field oxide 314 is provided along the sidewalls of the openings 312 formed in the OPON layer stack 310.

Figure 3E:
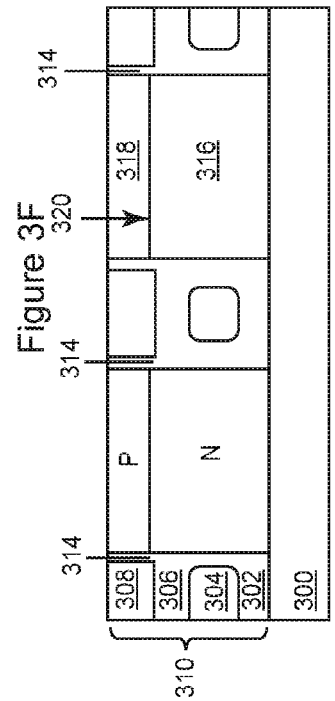

In FIG. 3E, a first epitaxial layer 316 of a first doping type (e.g. n-type as shown) is formed on the uncovered part 301 of the semiconductor substrate 300 and a second epitaxial layer 318 of the opposite doping type (e.g. p-type as shown) is formed above the first epitaxial layer 316 in the OPON layer stack openings 312 prior to removing the nitride layer 308 of the OPON layer stack 310. In another case, the doping types are reversed i.e. the first epitaxial layer is p-type and the second epitaxial layer is n-type. In general, the first and second epitaxial layers 316, 318 have the opposite doping type so that a pn-junction 320 is realized between these two epitaxial layers 316, 318. Any standard selective epitaxy and planarization process can be used as previously described herein. For example, the epitaxial layers can be doped as part of the epitaxy process, by implantation or by some combination of both. The second epitaxial layer 318 has lateral sides which face the nitride layer 308.

Figure 3F:
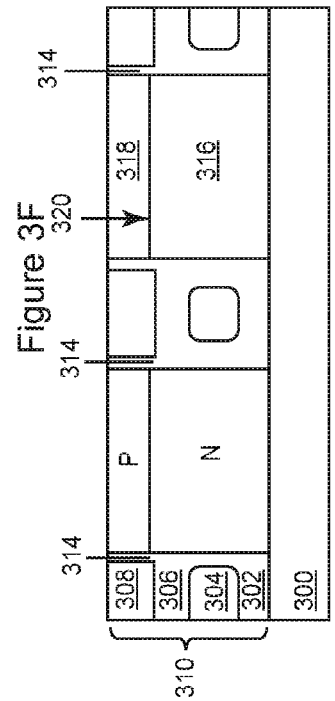

In FIG. 3F, an oxide recess process is performed to remove the oxide 314 from the lateral sides of the second epitaxial layer 318. The nitride layer 308 of the OPON layer stack 310 also is removed after forming the epitaxial layers 316, 318 to yield open spaces 322 in the OPON layer stack 310.

Figure 3G:
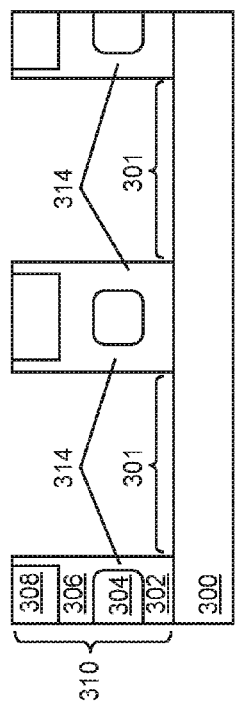

In FIG. 3G, a gate dielectric 324 is formed on the exposed lateral sides of the second epitaxial layer 318. Any standard gate dielectric process can be used. The open spaces 322 formed in the OPON layer stack 310 after the epitaxy process are then filled with an electrically conductive material 326 such as highly doped polycrystalline silicon, a silicide-polysilicon combination or metal as previously described herein. The electrically conductive material 326 forms a gate electrode in each electrode trench which is laterally surrounded by the second epitaxial layer 318 and insulated from the surrounding semiconductor material by the gate dielectric 324. The narrower electrically conductive islands 304' below and isolated from each gate electrode 326 form field electrodes which are insulated from the surrounding semiconductor material by the remaining field oxide 314 which was formed prior to the trench epitaxy process.

Figure 4:
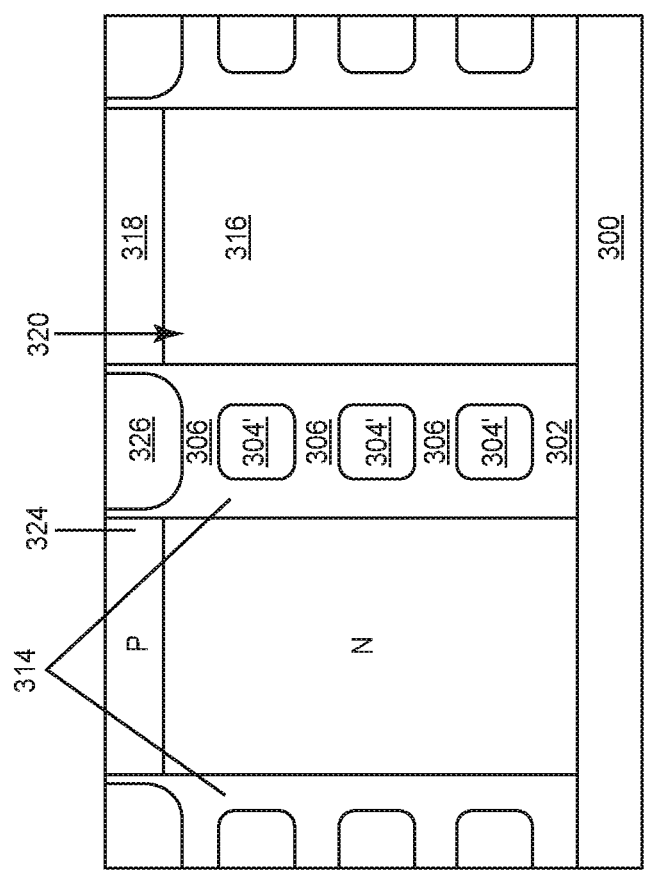
FIG. 4 illustrates a sectional view of an embodiment of a vertical power transistor formed by an electrode-aligned selective epitaxy method.

FIG. 4 illustrates another embodiment of trench electrode structures having a gate electrode and field plate in the same trench. The embodiment shown in FIG. 4 is similar to the embodiment shown in FIG. 3G and can be fabricated according to the method of FIG. 3 with the following modification. Instead of forming a single electrically conductive layer 304' as part of the OPON layer stack 310 shown in FIG. 3B, alternating layers of electrically conductive material 304' and dielectric material 306 can be deposited above the first (lowermost) dielectric layer 302. The (top) nitride layer 308 is then deposited on the uppermost one of the (interleaved) dielectric layers 306. The openings in the layer stack formed on the semiconductor substrate 300 extend through the nitride layer 308, the alternating layers of electrically conductive material and dielectric material 304', 306 and the first (lowermost) oxide layer 302 to the semiconductor substrate 300. The uppermost epitaxial layer 318 is formed laterally adjacent to the nitride layer 308, which is then removed (e.g. see FIG. 3F) so that the lateral sides of the uppermost epitaxial layer 318 can be re-oxidized to form the gate dielectric 324. According to this embodiment, each layer 304' of the electrically conductive material below the gate electrode forms a field electrode 304' which is vertically spaced apart from the other field electrodes 304' and the gate electrode 326 by the alternating layers of dielectric material 306.

FIGS. 5A through 5F illustrate another embodiment of a method of forming gate trench electrode structure having a gate electrode.

In FIG. 5A, a semiconductor substrate 400 is provided. The semiconductor substrate 400 can be an epitaxial layer grown on a semiconductor wafer or the wafer itself as previously described herein.

In FIG. 5B, an oxide layer 402 is deposited on the semiconductor substrate 400 and a layer 404 of electrically conductive material such as a polysilicon or metal layer is deposited on the first oxide layer 402 to form an oxide-poly layer stack 406.

In FIG. 5C, openings 408 are formed which extend through the electrically conductive layer 404 and the first oxide layer 402 of the oxide-poly layer stack 406 to form islands 404' of electrically conductive material. Any standard etch processing can be performed to yield the patterned oxide-poly structure shown in FIG. 5C.

In FIG. 5D, an oxide 410 is deposited along the bottom and sidewalls of the openings 408 in the oxide-poly layer stack 406 prior to an epitaxy fill process. The semiconductor substrate 400 can be thermally oxidized after the openings 408 are formed and prior to depositing the oxide 410 along the bottom and sidewalls of the openings 408. In each case, the oxide 408 forms a gate dielectric along the lateral sides of the electrically conductive islands 404'.

In FIG. 5E, the oxide 410 is removed from the bottom of the openings 408 in the oxide-poly layer stack 406 prior to the epitaxy fill process e.g. using an anisotropic dry etch process. As a result, the openings 408 extend through the oxide-poly layer stack 406 to the semiconductor substrate 400 such that part 401 of the semiconductor substrate 400 is uncovered and the gate oxide 410 remains along the lateral sides of the electrically conductive islands 404'.

In FIG. 5F, an epitaxial layer 412 such as Si epitaxy is formed on the uncovered part 401 of the semiconductor substrate 400. Any standard selective epitaxy and planarization process can be used as previously described herein. The islands 404' of electrically conductive material surrounded by the epitaxial layer 412 form gate electrodes. The gate electrodes 404' are insulated from the surrounding semiconductor material by the previously formed gate oxide 410. In one embodiment, the gate oxide 410 and the electrically conductive islands 404' are removed after the epitaxial layer 412 is formed. The gate oxide and gate electrodes can then be re-formed in the same open space to provide higher quality gate dielectric and gate electrodes.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming trench electrode structures, the method comprising:
   forming a first dielectric layer on a semiconductor substrate;
   forming a second layer above the first dielectric layer;
   forming an opening which extends through the second layer and the first dielectric layer to the semiconductor substrate such that part of the semiconductor substrate is uncovered;
   forming an epitaxial layer on the uncovered part of the semiconductor substrate;
   removing the second layer after forming the epitaxial layer; and
   filling an open space formed by removing the second layer with an electrically conductive material, the electrically conductive material forming an electrode which is laterally surrounded by the epitaxial layer.

2. The method of claim 1, wherein the first dielectric layer comprises oxide and the second layer is on the first oxide layer and comprises nitride.

3. The method of claim 2, further comprising:
   depositing a second oxide layer on the nitride layer,
   wherein the opening extends through the second oxide layer, the nitride layer and the first oxide layer to the semiconductor substrate.

4. The method of claim 3, further comprising:
   depositing oxide along a bottom and sidewalls of the opening prior to depositing the epitaxial layer;
   removing the oxide from the bottom of the opening prior to depositing the epitaxial layer and from at least an upper part of lateral sides of the epitaxial layer prior to filling the open space with the electrically conductive material such that at least the upper part of the lateral sides of the epitaxial layer is exposed; and
   forming a gate dielectric on the exposed part of the lateral sides of the epitaxial layer prior to filling the open space with the electrically conductive material.

5. The method of claim 1, wherein the first dielectric layer comprises oxide and the method further comprises:
   depositing an electrically conductive layer on the first oxide layer;
   depositing a second oxide layer on the electrically conductive layer; and
   depositing a nitride layer on the second oxide layer,
   wherein the nitride layer is the second layer,
   wherein the opening extends through the nitride layer, the second oxide layer, the electrically conductive layer and the first oxide layer to the semiconductor substrate.

6. The method of claim 5, further comprising:
   forming a semiconductor layer above the epitaxial layer in the opening prior to removing the second layer, the semiconductor layer being doped oppositely as the epitaxial layer and having lateral sides which face the second layer.

7. The method of claim 6, further comprising:
   forming a gate dielectric on the lateral sides of the semiconductor layer after removing the second layer and prior to filling the open space with the electrically conductive material.

8. The method of claim 5, further comprising:
   depositing oxide along a bottom and sidewalls of the opening prior to depositing the epitaxial layer;
   removing the oxide from the bottom of the opening prior to depositing the epitaxial layer and from at least an upper part of lateral sides of the epitaxial layer prior to filling the open space with the electrically conductive material such that at least the upper part of the lateral sides of the epitaxial layer is exposed; and
   forming a gate dielectric on the exposed part of the lateral sides of the epitaxial layer prior to filling the open space with the electrically conductive material.

9. The method of claim 1, further comprising:
depositing alternating layers of electrically conductive material and dielectric material above the first dielectric layer; and
depositing a nitride layer on an uppermost one of the dielectric layers,
wherein the nitride layer is the second layer,
wherein the opening extends through the nitride layer, the alternating layers of electrically conductive material and dielectric material and the first oxide layer to the semiconductor substrate,
wherein the electrically conductive material that fills the open space forms a gate electrode,
wherein each layer of electrically conductive material below the gate electrode forms a field electrode which is vertically spaced apart from the other field electrodes and the gate electrode by the alternating layers of dielectric material.

10. The method of claim 9, further comprising:
forming a semiconductor layer above the epitaxial layer in the opening prior to removing the second layer, the semiconductor layer being doped oppositely as the epitaxial layer and having lateral sides which face the second layer.

11. The method of claim 10, further comprising:
forming a gate dielectric on the lateral sides of the semiconductor layer after removing the second layer and prior to filling the open space with the electrically conductive material.

12. The method of claim 1, wherein the first dielectric layer comprises oxide and the second layer is on the first oxide layer and comprises polysilicon.

13. The method of claim 12, further comprising:
depositing oxide along a bottom and sidewalls of the opening prior to depositing the epitaxial layer;
removing the oxide from the bottom of the opening prior to depositing the epitaxial layer and from lateral sides of the epitaxial layer prior to filling the open space with the electrically conductive material such that the lateral sides of the epitaxial layer is exposed; and
forming a gate dielectric on the exposed lateral sides of the epitaxial layer prior to filling the open space with the electrically conductive material.

14. The method of claim 13, further comprising:
replacing the electrically conductive material with new electrically conductive material in the open space after forming the epitaxial layer.

15. The method of claim 14, further comprising:
replacing the gate dielectric with a new gate dielectric in the open space after forming the epitaxial layer and prior to replacing the electrically conductive material.

16. The method of claim 1, further comprising:
depositing oxide along a bottom and sidewalls of the opening prior to depositing the epitaxial layer; and
removing the oxide from the bottom of the opening prior to depositing the epitaxial layer.

17. The method of claim 16, further comprising:
thermally oxidizing the semiconductor substrate after the opening is formed and prior to depositing the oxide.

18. The method of claim 16, further comprising:
removing the oxide from lateral sides of the epitaxial layer prior to filling the open space with the electrically conductive material such that the lateral sides of the epitaxial layer are exposed; and
forming a gate dielectric on the exposed lateral sides of the epitaxial layer prior to filling the open space with the electrically conductive material.

19. The method of claim 16, further comprising:
removing the oxide from an upper part of lateral sides of the epitaxial layer prior to filling the open space with the electrically conductive material such that the upper part of the lateral sides of the epitaxial layer is exposed and a lower part of the lateral sides of the epitaxial layer remains covered by the oxide; and
forming a gate dielectric on the exposed upper part of the lateral sides of the epitaxial layer prior to filling the open space with the electrically conductive material.

20. The method of claim 1, wherein the semiconductor substrate is a Si substrate and the epitaxial layer is a Si epitaxial layer.

* * * * *